US008156336B2

(12) United States Patent
Brown et al.

(10) Patent No.: US 8,156,336 B2
(45) Date of Patent: Apr. 10, 2012

(54) DEVICE AUTHENTICATION

(75) Inventors: Michael Kenneth Brown, Fergus (CA); Herbert Anthony Little, Waterloo (CA); Dinah Lea Marie Davis, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 99 days.

(21) Appl. No.: 12/685,475

(22) Filed: Jan. 11, 2010

(65) Prior Publication Data

US 2010/0106970 A1 Apr. 29, 2010
US 2011/0191585 A2 Aug. 4, 2011

Related U.S. Application Data

(63) Continuation of application No. 10/836,107, filed on Apr. 30, 2004, now Pat. No. 7,647,498.

(51) Int. Cl.
*H04L 9/00* (2006.01)
*H04L 9/30* (2006.01)
*H04K 1/00* (2006.01)

(52) U.S. Cl. ........ 713/168; 713/171; 713/180; 713/181; 726/2; 726/10; 380/270; 380/278; 380/30; 380/44; 709/227; 709/230; 709/248

(58) Field of Classification Search .................... 713/168
See application file for complete search history.

(56) References Cited

U.S. PATENT DOCUMENTS

| 6,404,862 | B1 | 6/2002 | Holt |
| 6,567,916 | B1 | 5/2003 | Terao et al. |
| 6,920,559 | B1 * | 7/2005 | Nessett et al. ............... 713/168 |
| 6,950,948 | B2 | 9/2005 | Neff |
| 7,409,543 | B1 | 8/2008 | Bjorn |
| 7,716,483 | B2 * | 5/2010 | Sozzani et al. ............... 713/171 |
| 2002/0194080 | A1 | 12/2002 | Lourie |
| 2003/0046542 | A1 * | 3/2003 | Chen et al. ................... 713/176 |
| 2003/0182554 | A1 * | 9/2003 | Gentry et al. ............... 713/171 |
| 2003/0233546 | A1 | 12/2003 | Blom |
| 2005/0050322 | A1 * | 3/2005 | Mizrah ......................... 713/168 |

FOREIGN PATENT DOCUMENTS

| JP | 2005530429 A | 12/2003 |
| TW | 429721 B | 4/2001 |

(Continued)

OTHER PUBLICATIONS

Menezes et al.: "Handbook of Applied Cryptography", 1997, CRC Press, Boca Raton (US), XP002300789, p. 414-p. 415.

(Continued)

*Primary Examiner* — Edan Orgad
*Assistant Examiner* — Ronald Baum
(74) *Attorney, Agent, or Firm* — Integral Intellectual Property Inc.; Miriam Paton

(57) ABSTRACT

Authentication of two devices in communication with a third device is achieved where the first and second devices each possess a shared secret value. The authentication includes communication of authentication values from the first device to the second device using the third device. Similarly, there is communication of values from the second device to the first device using the third device. The third device retains the communicated values. The values are calculated to permit the third device to authenticate the first and second devices without the third device receiving the shared secret value. The authentication may be used to establish a communications channel between the first and the second devices.

28 Claims, 1 Drawing Sheet

FOREIGN PATENT DOCUMENTS

| | | |
|---|---|---|
| TW | 498669 B | 8/2002 |
| TW | 556425 B | 10/2003 |
| WO | 03077470 | 9/2003 |
| WO | 03107712 | 12/2003 |

OTHER PUBLICATIONS

Bai, Xuehui Third Office Action for CN 200510066892.6, Jan. 25, 2011.

Saxena, A. et al. "A Novel Method for Authenticating Mobile Agents with One-Way Signature Chaining" © 2005 IEEE (0-7803-8963-8/05).

Enhanced Privacy ID: A Direct Anonymous Attestation Scheme with Enhanced Revocation Capabilities, Cryptology ePrint Archive: Report 2007/194, [online], Version: 20070525: 085552, pp. 1-30, Ernie Brickell and Jiangtao Li, May 23, 2007.

Aoki, Shigenori, First Office Action for JP 2009-102504, Sep. 28, 2011.

* cited by examiner

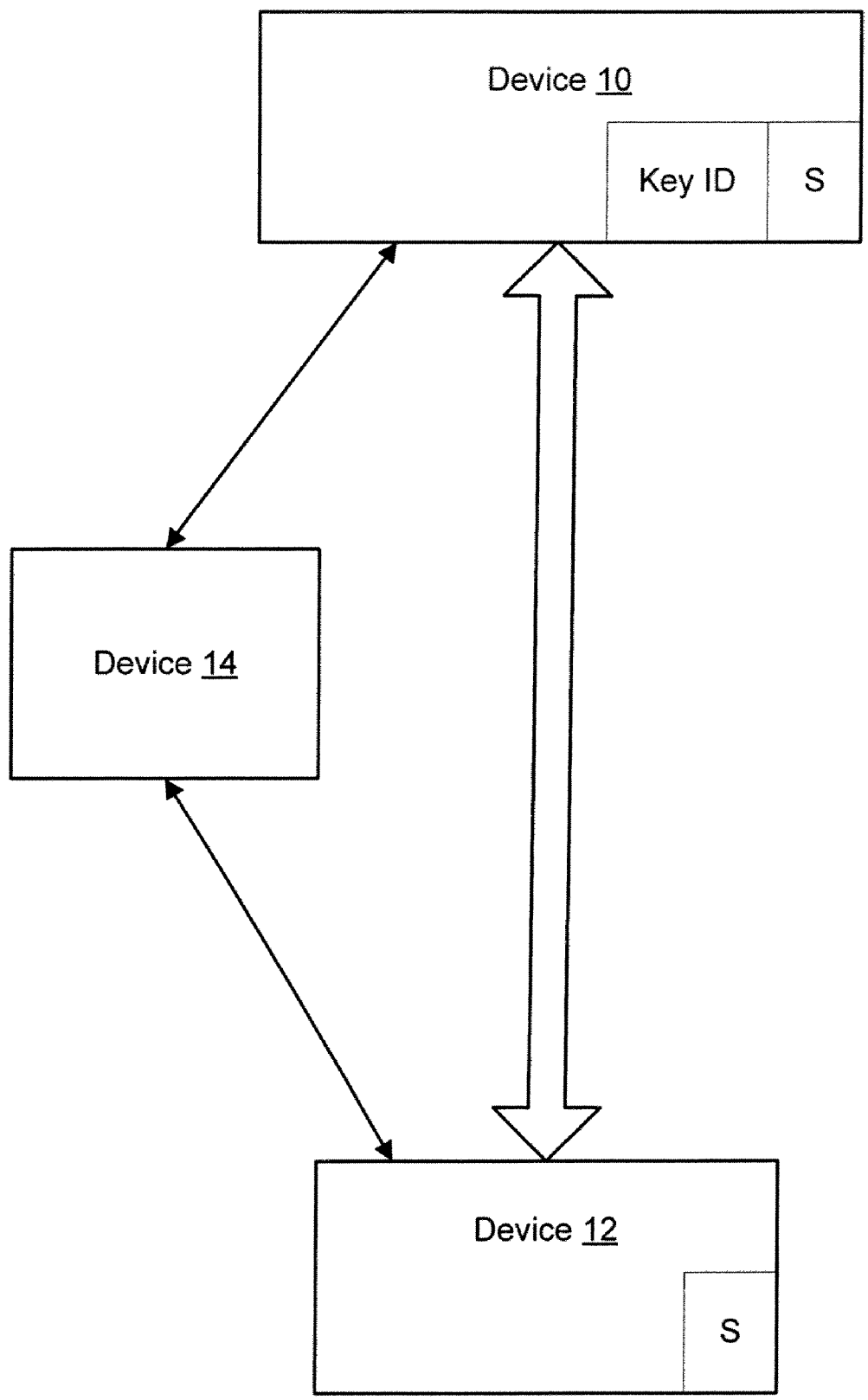

DEVICE AUTHENTICATION

REFERENCE TO PRIOR APPLICATIONS

This application is a Continuation of U.S. patent application Ser. No. 10/836,107, filed Apr. 30, 2004, now U.S. Pat. No. 7,647,498.

FIELD OF THE INVENTION

This invention relates generally to communication between electronic devices and, more particularly, to the authentication of two electronic devices including authentication by a third device.

BACKGROUND OF THE INVENTION

In communication between electronic devices, it is sometimes desirable for two devices to communicate with each other using a third device. Typically, one device will seek to establish communication with a second device by making a request to the third device. In such a circumstance, the third device may act as a gatekeeper and prevent or allow such communication based on permissions defined for the two devices.

Where the security of the communication between devices is in issue, the two communicating devices may be provided with a secret value or key that may be used to determine if a channel of communication may be established between the two devices. A third device may execute instructions to permit or deny communication between the devices, based on the shared values held by the respective communication devices.

In a more general way, there may be other reasons for authenticating two devices to a third device. In cases where each of the two devices to be authenticated each have the same secret value, the third device may authenticate the two devices by each of the devices providing their copies of the secret value to the third device for comparison.

However, if the communication between the first or second device and the third device is potentially not secure, or if the third device itself is potentially not secure, direct communication of the secret value or key to the third device is typically not desirable as the secrecy of the shared value is placed at risk.

It is therefore desirable to have a mechanism for authentication of two devices by a third device in which the risk of exposure of the shared value is reduced.

SUMMARY OF THE INVENTION

According to an aspect of the invention there is provided an improved method of device authentication.

According to another aspect of the invention there is provided an authentication procedure, to authenticate two devices each having a shared secret value, in which a third device is able to determine if each of the communicating devices has the same shared secret value without directly being provided with that value.

According to another aspect of the invention there is provided a method for a communications channel to be established between two devices using a third device. The two devices seeking to communicate are provided with a shared secret value. The communicating devices are able to prove to the third device that they each possess the same secret value (and are thus authenticated). In this authentication procedure, the third device is able to determine if each of the communicating devices has the same shared secret value without the third device being provided with that value.

According to another aspect of the invention there is provided a method for securely closing the communications channel established using the authentication described above.

According to another aspect of the invention there is provided a method for the authentication of a first and a second device by a third device, the first and the second devices each possessing a shared secret key value h, each of the devices having available to it a public key P, selected such that the operation of deriving the secret key value h from the product hP is a computationally difficult operation, the method comprising the steps of the first and the second device communicating a set of values to each other using the third device, such that the first device is able to calculate a first expression with a value equivalent to the product hP and the second device is able to calculate a second expression with a value equal to the product hP, the third device retaining copies of the values being communicated between the first and the second device, the method further comprising the step of the third device calculating and comparing the values of the first expression and of the second expression to authenticate the first and the second devices.

According to another aspect of the invention there is provided the above method in which the first device is a wireless handheld device, the second device is an enterprise server, and the third device is a router and in which the step of the third device authenticating the first and second devices comprises the step of establishing a communications channel between the first and second devices.

According to another aspect of the invention there is provided the above method in which the communications channel established includes the third device as part of the channel and the third device having retained the values communicated between the first device and the second device, the method further comprising the step of closing the communication channel between the second device and the third device, the step of closing the said channel comprising the steps of the second device and the third device exchanges sets of closing authentication values to permit the third device to carry out a computation of an expression based on the retained values and the closing authentication values to authenticate the closing the communication channel.

According to another aspect of the invention there is provided a method for the authentication of a first and a second device by a third device, the first and second devices each possessing a shared secret key value h, each of the devices is operative to carry out mathematical operations on defined groups $E(F_q)$ and $Z_p$, where $F_q$ is a finite field of prime order q, including scalar multiplication defined with reference to the group, the method comprising the steps of:

a) obtaining a public key P, such that P generates a prime subgroup of the group $E(F_q)$ of order p, and making available to each of the devices the public key P, b) the first device obtaining a random value $r_D$ such that $1 < r_D < p-1$, and calculating a value $R_D = r_D P$, c) the first device communicating the value $R_D$ to the third device, d) the third device retaining a copy of the value $R_D$ and forwarding the value $R_D$ to the second device, e) the second device obtaining a random value $r_B$ such that $1 < r_B < p-1$, and calculating a value $R_B = r_B P$, where $R_B$ is determined such that it is not equal to $R_D$, the second device obtaining a random value $e_D$ such that $1 < e_D < p-1$, the second device communicating the values $e_D$ and $R_B$ to the third device, f) the third device retaining copies of the values $R_B$ and $e_D$ forwarding the said values to the first device, g) the first device calculating a value $y_D = h - e_D r_D \mod p$, the first device obtaining a random value $e_B$ such that $1 < e_B p - 1$, the first device communicating values $y_D$ and $e_B$ to the third device, h) the third device retaining copies of the values $y_D$ and $e_B$ forwarding the said values to the second device, i) the second device calculating a value $y_B = h - e_B r_B \mod p$, the second device communicating the value $y_B$ to the third device, and j) the third device authenticating the first and second devices when the condition $y_B P + e_B R_B = y_D P + e_D R_D$ is satisfied.

According to another aspect of the invention there is provided the above method, further comprising the step of the first device authenticating the second device when the condition $y_B P + e_B R_B = hP$ is satisfied.

According to another aspect of the invention there is provided the above method, further comprising the step of the second device authenticating the first device when the condition $y_D P + e_D R_D = hP$ is satisfied.

According to another aspect of the invention there is provided the above method, in which the first device is identified by a non-authenticating identifier and in which the second device retains a set of key values which set includes a key value shared with the secret key value of the first device, the method comprising the step of the first device communicating the non-authenticating identifier to the second device whereby the second device may select the key value shared with the secret key value of the first device from the set of key values.

According to another aspect of the invention there is provided the above method, further comprising the step of deriving the value h from a shared secret value s.

According to another aspect of the invention there is provided the above method, in which the step of deriving the value h comprises the step of carrying out a one-way hash function on the shared secret value s.

According to another aspect of the invention there is provided the above method, further comprising the steps of one or more of the first, second and third devices checking that the value $e_D$ is not zero and/or that the value $e_B$ is not zero.

According to another aspect of the invention there is provided the above method, further comprising the steps of one or more of the first, second and third devices checking that the value $R_B$ is not equal to the point at infinity and/or that the value $R_D$ is not equal to the point at infinity.

According to another aspect of the invention there is provided the above method, further comprising the steps of one or more of the first, second and third devices checking that the value $R_B$ is not equal to the value $R_D$.

According to another aspect of the invention there is provided the above method in which the first device is a wireless handheld device, the second device is an enterprise server, and the third device is a router and in which the step of the third device authenticating the first and second devices comprises the step of establishing a communications channel between the first and second devices.

According to another aspect of the invention there is provided the above method in which the communications channel is defined by the assignment of an Internet Protocol address to the first device.

According to another aspect of the invention there is provided the above method in which the communications channel established includes the third device as part of the channel and the third device having retained the values $y_D$, P, $e_D$, and $R_D$, the method further comprising the step of closing the communication channel between the second device and the third device, the step of closing the said channel comprising the steps of:

k) the second device obtaining a random value $r_C$ such that $1 < r_C < p - 1$, and calculating a value $R_C = r_C P$, whereby $R_C$ is constrained to have a different value than both $R_B$ and $R_D$, l) the second device communicating the value $R_C$ to the third device, m) the third device obtaining a random value $e_C$ such that $1 < e_C < p - 1$, the third device communicating the value $e_C$ to the second device, n) the second device authenticating the close operation when the condition $y_C P + e_C R_C = y_D P + e_D R_D$ is satisfied.

According to another aspect of the invention there is provided the above method further comprising the steps of the second device checking that the value $e_C$ is not zero.

According to another aspect of the invention there is provided the above method, further comprising the steps of the third device checking that the value $R_C$ is not equal to the point at infinity.

According to another aspect of the invention there is provided the above method, further comprising the steps of one or both of the second and third devices checking that the value $R_C$ is not equal to the value $R_B$ and is not equal to the value $R_D$.

According to another aspect of the invention there is provided the above method, further comprising the steps of one or both of the second and third devices checking that the value $e_C$ is not equal to the value $e_D$ and is not equal to the value $e_B$.

According to another aspect of the invention there is provided the a program product comprising a medium having executable program code embodied in said medium, the executable program code being variously executable on a first device, a second device and a third device, the executable program code being operative to cause the above methods to be carried out.

According to another aspect of the invention there is provided a system comprising a first device, a second device, and a third device, the first and the second devices each possessing a shared secret key value h, each of the devices having available to it a public key P, selected such that the operation of deriving the secret key value h from the product hP is a computationally difficult operation, the first device, the second device and the third device each comprising memory units and processors for storing and executing program code, the program code being operative to cause communication of a set of values between the first device and the second device using the third device, the program code being operative to cause the first device to calculate a first expression with a value equivalent to the product hP and the second device to calculate a second expression with a value equal to the product hP, the program code being operative to cause the third device to retain copies of the values being communicated between the first and the second device, and the program code being operative to cause the third device to calculate and compare the values of the first expression and of the second expression to authenticate the first and the second devices.

According to another aspect of the invention there is provided the above system in which the first device is a wireless handheld device, the second device is an enterprise server, and the third device is a router and in which the program code operative to cause the third device to authenticate the first and second devices comprises program code operative to establish a communications channel between the first and second devices.

According to another aspect of the invention there is provided the above system in which the communications channel established includes the third device as part of the channel and the third device comprises memory to retain the values communicated between the first device and the second device, the program code further comprising the program code operative to close the communication channel between the second device and the third device, the said code comprising program code operative to exchange sets of closing authentication values between the second device and the third device to permit the third device to carry out a computation of an expression based on the retained values and the closing authentication values to authenticate the closing the communication channel.

According to another aspect of the invention there is provided a system comprising a first device, a second device, and a third device, the first and second devices each possessing a shared secret key value h, each of the devices being operative to carry out mathematical operations on defined groups $E(F_q)$ and $Z_p$, where $F_q$ is a finite field of prime order q, including scalar multiplication defined with reference to the group, the first device, the second device and the third device each comprising memory units and processors for storing and executing program code o) the program code being operative to obtain a public key P, such that P generates a prime subgroup of the group $E(F_q)$ of order p, and to make available to each of the devices the public key P, p) the program code being operative to cause the first device to obtain a random value $r_D$ such that $1 < r_D < p-1$, and to calculate a value $R_D = r_D P$, q) the program code being operative to cause the first device to communicate the value $R_D$ to the third device, r) the program code being operative to cause the third device to retain a copy of the value $R_D$ and to forward the value $R_D$ to the second device, s) the program code being operative to cause the second device to obtain a random value $r_B$ such that $1 < r_B < p-1$, and to calculate a value $R_B = r_B P$, where $R_B$ is determined such that it is not equal to $R_D$, and to cause the second device to obtain a random value $e_D$ such that $1 < e_D < p-1$, and to communicate the values $e_D$ and $R_B$ to the third device, t) the program code being operative to cause the third device to retain copies of the values $R_B$ and $e_D$ and to forward the said values to the first device, u) the program code being operative to cause the first device to calculate a value $y_D = h - e_D r_D$ mod p, to cause the first device to obtain a random value $e_B$ such that $1 < e_B < p-1$, and to cause the first device to communicate values $y_D$ and $e_B$ to the third device, v) the program code being operative to cause the third device to retain copies of the values $y_D$ and $e_B$ and to forward the said values to the second device, w) the program code being operative to cause the second device to calculate a value $y_B = h - e_B r_B$ mod p, and to cause the second device to communicate the value $y_B$ to the third device, and x) the program code being operative to cause the third device to authenticate the first and second devices when the condition $y_B P + e_B R_B = y_D P + e_D R_D$ is satisfied.

According to another aspect of the invention there is provided the above system in which the first device is a wireless handheld device, the second device is an enterprise server, and the third device is a router and in which the program code operative to cause the third device to authenticate the first and second devices comprises program code operative to establish a communications channel between the first and second devices.

Advantages of the invention include authentication of two devices to a third device, without the need for the third device to have communicated to it, or to have direct information about, a shared secret value possessed by the two authenticated devices.

BRIEF DESCRIPTION OF THE DRAWINGS

In drawings which illustrate by way of example only a preferred embodiment of the invention, FIG. 1 is block diagram showing two devices and a third device used in the authentication of the first two devices.

DETAILED DESCRIPTION OF THE INVENTION

There are many different contexts in which communications are sought to be established between two different electronic devices and a third device is used to control whether such communication is to take place or not. FIG. 1 is a block diagram that shows device 10 and device 12, for which a communications channel is to be established. In the example of FIG. 1, device 14 determines whether such communications may take place, or not. The determination is made on the basis of authentication of devices 10, 12 by establishing that each device has the shared secret value. In the example of FIG. 1, a direct communications channel is shown between devices 10, 12. Other arrangements are also possible in which devices 10, 12 use device 14 to establish communications and in which, for example, all communications are routed through device 14.

The description of the preferred embodiment refers to communicating devices but it will be understood by those in the art that approach of the preferred embodiment may be implemented for other contexts where authentication of two devices is carried out by a third device. Each of devices 10, 12 must be able to communicate with device 14, but the ultimate purpose of the authentication of devices 10, 12 need not be for their communication with each other.

It will be understood by those skilled in the art that electronic devices, as referred to in this description, include all manner of devices that are able to establish communications with other devices and are able to carry out computations as described below. In particular, the devices include communications servers such as e-mail and other message servers for use in conjunction with networks such as the Internet, wireless handheld communications devices, and other server, desktop, portable or handheld devices, including devices typically used in a computing environment or in telephony.

The preferred embodiment is described as a method that is implemented with respect to such electronic devices. The implementation may be embodied in a computer program product that includes program code on a medium that is deliverable to the devices referred to in this description. Such program code is executable on the devices referred to so as to carry out the method described.

One example of an implementation of the preferred embodiment includes a configuration in which device 14 of FIG. 1 is a router used to assign an IP (Internet Protocol) address to device 10 which is a wireless handheld device. The router of device 14 sets up the connection between the wireless handheld device 10 and an enterprise server, represented in the example of FIG. 1 by device 12. In this example, the device 14 router forwards traffic to the device 10 handheld from device 12 enterprise server. To ensure that no other device is able to improperly obtain an IP address from the device 14 router, in the preferred embodiment both the device 10 handheld and the device 12 enterprise server have a secret value s. As is set out below, the device 14 router is able to establish that the device 10 (handheld) is a trusted device and a communications channel with the device 12 (enterprise server) should be set up by the device 14 (router). In this example, once the authentication has been done by the device 14 router, it forwards communications to the handheld of device 10 by using an assigned IP address and forwarding communications from the enterprise server of device 12 using the Internet.

The description of the preferred embodiment set out below includes several steps in which values as sent between devices are checked. To ensure that there is only one point of failure in the method, when such a check determines that there is an error condition, the approach of the preferred embodiment is to redefine one of the values in a manner that will cause the method to fail to authenticate the devices in its final steps. As will be appreciated by those skilled in the art, there may be other approaches used for carrying out such checking that will result in the method being terminated at an earlier point or in an error condition being specified in another manner.

The preferred embodiment is described with reference to devices 10, 12, 14, each of which are capable of carrying out cryptographic functions and which share, in the embodiment, the following cryptosystem parameters. The mathematical operations described are carried out in groups $E(F_q)$ and $Z_p$. The group $E(F_q)$ is defined in the preferred embodiment as the National Institute of Standards and Technology (NIST) approved 521-bit random elliptic curve over $F_q$. This curve has a cofactor of one. The field $F_q$ is defined as a finite field of prime order q. $Z_p$ is the group of integers modulo p. In the description below, the public key P is defined as a point of $E(F_q)$ that generates a prime subgroup of $E(F_q)$ of order p. The notation xR represents elliptic curve scalar multiplication, where x is the scalar and R is a point on $E(F_q)$. This elliptic curve point R sometimes needs to be represented as an integer for some of the calculations. This representation is $$\bar{R} = (\bar{x} \bmod 2^{\frac{f}{2}}) + 2^{\frac{f}{2}},$$

where $\bar{x}$ is the integer representation of the x-coordinate of the elliptic curve point R and $f = \log_2 p + 1$ is the bit length of p.

As will be appreciated, for different implementations of the preferred embodiment, the choice for the groups over which the operations of the preferred embodiment are to be carried out may vary. The elliptic curve is a common group for such operations in cryptography. Any mathematically defined group can be used for the implementation of the preferred embodiment. For example, the group defined by integers modulo a prime number can be used for an implementation.

In Table 1, set out as follows, the calculations and communications of the preferred embodiment are set out. In the preferred embodiment, s is the shared value known to both device 10 and device 12, but not to device 14. In the preferred embodiment, device 12 may communicate with one or more devices and therefore device 10 is provided with an identifier Key ID that specifies which device or class of devices is seeking to communicate with device 12. Similarly, device 12 may, in other implementations, be provided with an identifier to allow device 10 to specify which device is seeking to be authenticated. It will be appreciated that the Key ID described is not sufficient, in itself, to authenticate the device. It will also be appreciated that if the identity of device 10 is obvious from the context, the Key ID may not be necessary. For instance, if device 12 communicates with a single device 10, and no other such devices, then the Key ID may not be necessary.

TABLE 1

| DEVICE 10 | DEVICE 14 | DEVICE 12 |
|---|---|---|
| Compute:<br>h = SHA-512(s)<br>Generate random $r_D$,<br>$1 < r_D < p - 1$<br>Calculate $R_D = r_D P$<br>Send $R_D$ to Device 14;<br>Send Key ID to Device 14. | | Compute:<br>h = SHA-512(s) |
| | While $R_D$ == point of infinity, then $R_D$ = rand( ).<br>Send $R_D$ to Device 12;<br>Send Key ID to Device 12 | |
| | | While $R_D$ == point at infinity, then $R_D$ = rand( ).<br>Generate random $r_B$,<br>$1 < r_B < p - 1$<br>Calculate $R_B = r_B P$<br>While $R_D$ == $R_B$, then choose another $R_B$.<br>Generate random $e_D$,<br>$1 < e_D < p - 1$<br>Send Key ID, $e_D$ and $R_B$ to Device 14. |
| | While $R_B$ == point at infinity or $R_D$ == $R_B$, then $R_B$ = rand( ).<br>While $e_D$ == 0, then $e_D$ = rand( ).<br>Send Key ID, $e_D$ and $R_B$ to Device 10. | |

TABLE 1-continued

| DEVICE 10 | DEVICE 14 | DEVICE 12 |
|---|---|---|
| While $R_B$ == point at infinity or $R_D$ == $R_B$, then $R_B$ = rand( ). While $e_D$ == 0, $e_D$ = rand( ). Compute $y_D$ = h − $e_D$ $r_D$ mod p Generate random $e_B$, 1 < $e_B$ < p − 1 Send $y_D$ and $e_B$ to Device 14. | | |
| | While $e_B$ == 0 or $e_B$ == $e_D$, then $e_B$ = rand( ). Send $y_D$ and $e_B$ to Device 12. | |
| | | While $e_B$ == 0 or $e_B$ == $e_D$, then $e_B$ = rand( ). Compute $y_B$ = h − $e_B$ $r_B$ mod p. Send $y_B$ to Device 14. |
| | Send $y_B$ to Device 10. | |
| If $y_B P + e_B R_B$ != hP, then reject | If $y_B P + e_B R_B$ != $y_D P + e_D R_D$, then reject | If $y_D P + e_D R_D$ != hP, then reject |

The above table specifies steps taken in the process of the preferred embodiment for carrying out authentication of the two communicating devices (devices 10, 12) that includes third party authentication (device 14). It will be understood by those skilled in the art that certain steps may be taken in different order and that, as indicated below, certain steps may be omitted.

The first step carried out in the preferred embodiment is for each of devices 10, 12 to compute a hash function based on the shared secret value s. In the preferred embodiment this hash function is the SHA-512 hash function as defined in the Federal Information Processing Standards Publication 180-2. Other similar hash functions may be used. The value h that is arrived at by applying the hash function is used by both devices 10, 12. Use of a hash function value h instead of direct use of the value s makes the process more secure as the secret shared value s is not directly used in the different calculations set out below. In the preferred embodiment, to provide the shared value s to both devices at an initialization stage, the value s may be randomly generated by one of devices 10, 12 and then communicated to the other using a secure communications channel. For example, where device 10 is a wireless handheld device and device 12 is an enterprise server, the value of the shared secret value can be generated by the enterprise server and then communicated to the wireless handheld when that device is in a cradle that is connected to the enterprise server by a secure network connection.

After determining the value h, the next step in the authentication process of the preferred embodiment is for device 10 to generate a random $r_D$ value to be combined with a public key value P. This random value is defined to be greater than 1 and less than p−1. In this example, p is defined to be the order of the prime subgroup of $E(F_q)$ generated by the point P in elliptic curve $E(F_q)$. Once the random $r_D$ value is obtained, the value $R_D$ is calculated by taking the result of the scalar multiplication $r_D P$. This randomized public key value ($R_D$) is then sent, with the Key ID value, to device 14. At device 14, an error check on the $R_D$ value is carried out. If $R_D$ is equal to the point of infinity then there is an error in the public key value (if P is a valid public key then the scalar product will not equal the point of infinity). According to the preferred embodiment, error handling is carried out by setting the $R_D$ value equal to a random value (specified by the pseudo code $R_D$=rand( ) in Table 1). The $R_D$ value and the Key ID value are then forwarded by device 14 to device 12. It will be noted that in the preferred embodiment, device 14 will retain in memory certain of the values that it receives and forwards. These retained values are used in a final authorization step, as is described below.

At device 12, there is a further error check on the $R_D$ value (in comparison with the point of infinity) and a similar error handling step is carried out if necessary. Device 12 also generates its own random value for combination with the public key P. The random value $r_B$ is defined in the range of 1 to p−1 and the scalar product $r_B P$ defines the value $R_B$. An error check at device 12 is carried out to ensure that $R_B$ is not equal to $R_D$. If these values are equivalent then a new random value $r_B$ is defined and a new $R_B$ value is calculated. This step is taken because where $R_B$ is the equivalent of $R_D$, it is possible for an attacker to determine the value of h.

Also in this step at device 12 a randomly defined challenge value $e_D$ is obtained. This $e_D$ value is generated so as to be greater than 1 and less than p−1. Both the $e_D$ and $R_B$ values as determined by device 12 are sent by device 12 to device 14. Device 14 may be carrying out multiple similar transactions simultaneously with a set of devices that includes device 10. In order to allow device 14 to determine which of the set of devices including device 10 to send the values to, the Key ID value is also returned to device 14 by device 12, along with the $e_D$ and $R_B$ values.

At device 14, there is an error check carried out on the $R_B$ value. The $R_B$ value is compared to the point of infinity and an error handling step is potentially taken. The comparison and error handling are carried out for the $R_B$ value in the same way as $R_D$ was compared and an error handling step taken in the earlier steps set out above. Similarly, the values of $R_D$ and $R_B$ are compared to each other and if they are determined to be equivalent then as an error handling step, $R_B$ is defined to be a random value. The equivalence of $R_D$ and $R_B$ is recognized as an error condition because device 12 generates $R_B$ in a manner that ensures that it has a different value than $R_D$. If, on receipt by device 14, the two values are identical then there must have been an error in transmission or an attacker has redefined the values.

A further check is carried out at device 14 at this time to ensure that $e_D$ does not have a value of 0. If the value is 0 then the $e_D$ value is set to a random value. If $e_D$ has been set to a value of 0 (potentially by an attacker seeking to obtain information to allow a false authentication) then the value of h may become known. To avoid this, $e_D$ is given a random value. It will be appreciated that although the check to ensure that $R_D$ is not equal to $R_B$ and the check to ensure that $e_D$ is not equal to 0 may be referred to as error checks, these checks are carried out to ensure that an attacker is not able to obtain information about the value of h.

Once the checking referred to above is complete, device 14 sends Key ID, $R_B$ and $e_D$ to device 10.

In the preferred embodiment, on receipt of the Key ID, $R_B$ and $e_D$ values, device 10 will carry out the same checks that were carried out at device 10, and take the same error handling steps (setting either $R_B$ or $e_D$ to 0, as needed). As was the case with the communication of the values between device 12 and device 14, the communication between device 14 and device 10 is a potential point at which an attacker may seek to alter values to gain access to the communication channel through improper authentication of a device.

As is shown in Table 1, once the checking of values $R_B$ and $e_D$ has taken place at device 10, there is a calculation of a $y_D$ value. The definition of the value is:

$$y_D = h - e_D r_D \bmod p$$

As is described in more detail below, the $y_D$ value is used in comparisons that will authenticate the devices 10, 12 to each other and to device 14.

Another step carried out by device 10 is the generation of a challenge value. This challenge value is an $e_B$ value that is randomly chosen from the range greater than 1 and less than p−1. Both $y_D$ and $e_B$ values are then sent to device 14.

At device 14, the $e_B$ value is compared with 0 and with $e_D$. If $e_B$ has a value equal to either of these, then $e_B$ is set to a random value.

The $e_B$ value is then sent by device 14 to device 12, along with the $y_D$ value. At device 12 the $e_B$ value is again checked (against 0 and $e_D$) and if the check is not successful, $e_B$ is set to a random value. A $y_B$ value is then calculated:

$$y_B = h - e_B r_B \bmod p$$

As will be seen, the value $y_B$ is defined in a manner symmetrical to the definition of $y_D$. The $y_B$ value is sent by device 12 where was calculated, to device 14 and from there to device 10.

At this point in the process, the $y_D$ and $R_D$ values have been sent by device 10 to device 12, and the $y_B$ and $R_B$ values has been sent by device 12 to device 10. Further, copies of the values that have been forwarded to and sent from device 14 have also be retained at device 14. Consequently, as will be seen in the last step of Table 1, authentication steps are carried out to authenticate that both device 10 and device 12 have the same shared secret value s.

In particular, at device 14, there is an authentication of the two devices if and only if $$y_B P + e_B R_B = y_D P + e_D R_D.$$

At device 10, there is authentication of device 12 if and only if $$y_B P + e_B R_B = hP.$$

At device 12, there is authentication of device 10 if and only if $$y_D P + e_D R_D = hP.$$

As will be apparent to those skilled in the art, the process of authentication set out above makes use of certain of the mathematical operations and equivalencies described and used in the Schnorr identification scheme (see for example A. Menezes, P. van Oorschot and S. Vanstone. *Handbook of Applied Cryptography*, CRC Press, New York, 1997). The preferred embodiment, however, permits two devices to mutually authenticate each other and to permit a third device to authenticate both devices. The authentication is carried out by the third device (device 14 in the example) despite the fact that the third device does not know the secret value s that is shared between the two devices 10, 12. It will be noted that the mutual authentication between devices 10, 12 is carried out at the same time, as a result of a series of overlapping steps having been taken.

The authentication process of the preferred embodiment is suitable for use where a communications channel between two devices is being defined and a third device will provide information to allow the channel to be set up. This may occur where a wireless handheld uses a routing device to gain access to an enterprise server. The routing device acts as the third device that requires authentication of the server and the wireless handheld device. The above process permits such authentication to be carried out and to have the third device (the router, for example) make the authentication without having knowledge of the secret value and with a reduced set of state information.

The above description of the preferred embodiment includes error checking applied to the R value. This is carried out to determine if R is a valid public key value. As will be appreciated, this error checking may be omitted from the method of the preferred embodiment if it can be ensured that $R_D$ is not equal to $R_B$, although it is generally preferable to carry out these checks to ensure that the process is being carried out correctly. Further the preferred embodiment describes the computation of a hash value of the secret value at device 10 and at device 12. The use of a hash function to encode the secret value s as the value h, is not required although it is a preferred step to minimize the direct use of the secret value. If there is no use of a hash function in this manner, the secret value is used directly to calculate the different authentication values.

As referred to above, the authentication process may be used in establishing a communications channel from one device to a second device through a third device. In this case, it is advantageous to use an authenticated protocol to close the channel as between the third device and one of the other two. In the preferred embodiment such an authenticated close protocol may be put in place on the basis that the third device retains certain values. In particular, after the authentication has taken place prior to establishing the communications channel, the third device (device 14, in the example of FIG. 1) retains values $y_D P + e_D R_D$, $R_D$, $R_B$, $e_D$, $e_B$. Device 12 retains values $R_D$, $R_B$, $e_D$, $e_B$, h. In Table 2, an authentication process is set out for use where device 14 has authenticated device 12, as is set out above and device 12 seeks to close the communications channel.

| Device 14 | Device 12 |
|---|---|
|  | Device 12 initiates closing the connection with device 14. Pick random $r_C$, $1 < r_C < p - 1$ |

| Device 14 | Device 12 |
|---|---|
| | Calculate $R_C = r_C P$ |
| | While $R_C == R_B$ or $R_C == R_B$, then choose another $R_C$. |
| | Send to $R_C$ device 14. |
| While $R_C ==$ point at infinity or $R_C == R_B$ or $R_C == R_D$, then $R_C =$ rand( ). | |
| Generate random $e_C$, $1 < e_C < p - 1$ | |
| While or $e_C == e_D$ or $e_C == e_B$, then choose another $e_C$. | |
| Send to $e_C$ device 12. | |
| | While $e_C == 0$ or $e_C == e_D$ or $e_C == e_B$, |
| | then $e_C =$ rand( ). |
| | Compute $y_C = h - e_C r_C$ mod p |
| | Send to $y_C$ device 14. |
| If $y_C P + e_C R_C != y_D P + e_D R_D$, then reject | |

As will be seen from the above, the authentication for the close protocol is available, even though device 14 (the third device) does not possess or use directly security value s or the hash value h. In this case, the authentication follows the Schnorr identification scheme, based on the values that are retained by the devices referred to above (devices 12, 14 in the example given). These values are available to the third device as a result of using the authentication process described above.

Various embodiments of the present invention having been thus described in detail by way of example, it will be apparent to those skilled in the art that variations and modifications may be made without departing from the invention. The invention includes all such variations and modifications as fall within the scope of the appended claims.

We claim:

1. A method for determining whether a first device and a second device both possess a value h, the method comprising:
receiving and storing a product $R_D$ from the first device, wherein $R_D$ is a product of a random value $r_D$ and a public key value P;
receiving and storing a product $R_B$ and a challenge value $e_D$ from the second device, wherein $R_B$ is a product of a random value $r_B$ and the public key value P;
transmitting the challenge value $e_D$ to the first device;
receiving and storing a value $y_D$ and a challenge value $e_B$ from the first device, wherein a first expression involving the value $y_D$, the random value $r_D$ and the challenge value $e_D$ has a value equivalent to a product hP of the value h and the public key value P;
transmitting the challenge value $e_B$ to the second device;
receiving and storing a value $y_B$ from the second device, wherein a second expression involving the value $y_B$, the challenge value $e_B$ and the random value $r_B$ has a value equivalent to the product hP; and
determining that the first device and the second device are both in possession of the value h when a condition $y_B P + e_B R_B = y_D P + e_D R_D$ is satisfied.

2. The method of claim 1, further comprising establishing a communications channel between the first device and the second device once having determined that the first device and the second device are both in possession of the value h.

3. The method of claim 2, further comprising:
receiving a product $R_C$ from the second device, wherein $R_C$ is a product of a random value $r_c$ and the public key value P, and further wherein $R_C$ is constrained to have a different value than both the product $R_B$ and the product $R_D$;
obtaining a challenge value $e_C$ that is constrained to have a different value than both the challenge value $e_B$ and the challenge value $e_D$, and communicating the challenge value $e_C$ to the second device;
receiving a value $y_C$ from the second device, wherein a third expression involving the value $y_C$, the random value $r_C$, and the challenge value $e_C$ has a value equivalent to the product hP; and
closing the communications channel when a condition $y_C P + e_C R_C = y_D P + e_D R_D$ is satisfied.

4. The method of claim 2, wherein the communications channel is a direct communications channel between the first device and the second device.

5. The method of claim 2, wherein all communications over the communications channel are routed through a third device.

6. The method of claim 1, wherein the public key value P generates a prime subgroup of the group $E(F_q)$ of order p, wherein $F_q$ is a finite field of prime order q, wherein the random values $r_D$ and $r_B$ are between the number 1 and the number (p−1), and wherein the challenge values $e_D$ and $e_B$ are between the number 1 and the number (p−1).

7. The method of claim 1, wherein the value h is derived from a secret value s, the method further comprising:
determining that the first device and the second device are both in possession of the secret value s when the condition $y_B P + e_B R_B = y_D P + e_D R_D$ is satisfied.

8. The method of claim 7, wherein the value h is a hash of the secret value s.

9. The method of claim 1, further comprising:
transmitting the product $R_B$ to the first device and transmitting the value $y_B$ to the first device, thus enabling the first device to determine whether the second device is in possession of the value h by the first device checking whether a condition $y_B P + e_B R_B = hP$ is satisfied.

10. The method of claim 1, further comprising:
transmitting the product $R_D$ to the second device and transmitting the value $y_D$ to the second device, thus enabling the second device to determine whether the first device is in possession of the value h by the second device checking whether a condition $y_D P + e_D R_D = hP$ is satisfied.

11. A method, comprising:
determining, at a third device, that a condition $y_B P + e_B R_B = y_D P + e_D R_D$ is satisfied; and
establishing, by the third device, a communications channel between a first device and a second device upon determining that said condition is satisfied, wherein:
$R_D$ is defined at the first device as a product of a random value $r_D$ and P, wherein $1 < r_D < p-1$, and further wherein $R_D$ is provided to the second device via the third device;
$e_B$ is defined at the first device, wherein $1 < e_B < p-1$, and further wherein $e_B$ is provided to the second device via the third device;
$R_B$ is defined at the second device as a product of a random value $r_B$ and P, wherein $1 < r_B < p-1$, and further wherein $R_B$ is provided to the first device via the third device;
$e_D$ is defined at the second device, wherein $1 < e_D < p-1$, and further wherein $e_D$ is provided to the first device via the third device;
$y_D$ is defined at the first device by a first expression using $r_D$ and $e_D$, the first expression having a value equivalent to a product hP, wherein h is a shared value stored at both the first device and the second device, and further wherein $y_D$ is provided to the second device via the third device; and $y_B$ is defined at the second device by a second expression using $e_B$ and $r_B$, the second expression having a value equivalent to the product hP, wherein P is a point in an elliptic curve $E(F_q)$, and p is defined as an order of a prime subgroup of $E(F_q)$ generated by the point P in $E(F_q)$.

12. The method of claim 11, further comprising:

determining, at the third device, that a further condition $y_C P + e_C R_C = y_D P + e_D R_D$ is satisfied; and closing, by the third device, the communications channel between the second device and the third device upon determining that said further condition is satisfied, wherein:

$R_C$ is defined at the second device as a product of a random value $r_C$ and P wherein $1 < r_C < p-1$, and further wherein $R_C$ is constrained to have a different value than both the product $R_B$ and the product $R_D$;

$e_C$ is defined at the third device such that $1 < e_C < p-1$ and further wherein $e_C$ is communicated to the second device; and $y_C$ is defined at the second device such that $y_C = h - e_C r_C \mod p$.

13. The method of claim 12, wherein $e_C$ is a random value.

14. The method of claim 11, wherein $e_D$ and $e_B$ are random values.

15. A program product comprising a computer readable non-transitory storage medium having executable program code stored in said medium, the executable program code being operative, when executed, to cause a communications device to:

receive and store a product $R_D$ from a first device, wherein $R_D$ is a product of a random value $r_D$ and a public key value P;

receive and store a product $R_B$ and a challenge value $e_D$ from a second device, wherein $R_B$ is a product of a random value $r_B$ and the public key value P;

transmit the challenge value $e_D$ to the first device;

receive and store a value $y_D$ and a challenge value $e_B$ from the first device, wherein a first expression involving the value $y_D$, the random value $r_D$ and the challenge value $e_D$ has a value equivalent to a product hP of the value h and the public key value P;

transmit the challenge value $e_B$ to the second device;

receive and store the value $y_B$ from the second device, wherein a second expression involving the value $y_B$, the challenge value $e_B$ and the random value $r_B$ has a value equivalent to the product hP; and determine that the first device and the second device are both in possession of the value h when a condition $y_B P + e_B R_B = y_D P + e_D R_D$ is satisfied.

16. The program product of claim 15, the executable program code further being operative, when executed, to cause a communications device to establish a communications channel between the first device and the second device once having determined that the first device and the second device are both in possession of the value h.

17. The program product of claim 15, further comprising:

receiving a product $R_C$ from the second device, wherein $R_C$ is a product of a random value $r_C$ and the public key value P, and further wherein $R_C$ is constrained to have a different value than both the product $R_B$ and the product $R_D$;

obtaining a challenge value $e_C$ that is constrained to have a different value than both the challenge value $e_B$ and the challenge value $e_D$, and communicating the challenge value $e_C$ to the second device;

receiving a value $y_C$ from the second device, wherein a third expression involving the value $y_C$, the random value $r_C$, and the challenge value $e_C$ has a value equivalent to the product hP; and closing the communications channel when a condition $y_C P + e_C R_C = y_D P + e_D R_D$ is satisfied.

18. The program product of claim 15, the executable further being operative, when executed, to cause a communications device to:

transmit the product $R_B$ to the first device and transmit the value $y_B$ to the first device, thus enabling the first device to determine whether the second device is in possession of the value h by the first device checking whether a condition $y_B P + e_B R_B = hP$ is satisfied.

19. The program product of claim 15, the executable further being operative, when executed, to cause a communications device to:

transmit the product $R_D$ to the second device and transmit the value $y_D$ to the second device, thus enabling the second device to determine whether the first device is in possession of the value h by the second device checking whether a condition $y_D P + e_D R_D = hP$ is satisfied.

20. A communications device adapted to:

receive and store a product $R_D$ from a first device, wherein $R_D$ is a product of a random value $r_D$ and a public key value P;

receive and store a product $R_B$ and a challenge value $e_D$ from a second device, wherein $R_B$ is a product of a random value $r_B$ and the public key value P;

transmit the challenge value $e_D$ to the first device;

receive and store a value $y_D$ and a challenge value $e_B$ from the first device, wherein a first expression involving the value $y_D$, the random value $r_D$ and the challenge value $e_D$ has a value equivalent to a product hP of the value h and the public key value P;

transmit the challenge value $e_B$ to the second device;

receive and store the value $y_B$ from the second device, wherein a second expression involving the value $y_B$, the challenge value $e_B$ and the random value $r_B$ has a value equivalent to the product hP; and determine that the first device and the second device are both in possession of the value h when a condition $y_B P + e_B R_B = y_D P + e_D R_D$ is satisfied.

21. The communications device of claim 20, wherein the communications device comprises a router.

22. The communications device of claim 20, further adapted to establish a communications channel between the first device and the second device.

23. The communications device of claim 22, further adapted to:

receive a product $R_C$ from the second device, wherein $R_C$ is a product of a random value $r_C$ and the public key value P, and further wherein $R_C$ is constrained to have a different value than both the product $R_B$ and the product $R_D$;

obtain a challenge value $e_C$ that is constrained to have a different value than both the challenge value $e_B$ and the challenge value $e_D$, and communicating the challenge value $e_C$ to the second device;

receive a value $y_C$ from the second device, wherein a third expression involving the value $y_C$, the random value $r_C$, and the challenge value $e_C$ has a value equivalent to the product hP; and close the communications channel when a condition $y_C P + e_C R_C = y_D P + e_D R_D$ is satisfied.

24. The communications device of claim 20, further adapted to:

transmit the product $R_B$ to the first device and transmit the value $y_B$ to the first device, thus enabling the first device to determine whether the second device is in possession of the value h by the first device checking whether a condition $y_B P + e_B R_B = hP$ is satisfied.

25. The communications device of claim 20, further adapted to:

transmit the product $R_D$ to the second device and transmit the value $y_D$ to the second device, thus enabling the second device to determine whether the first device is in possession of the value h by the second device checking whether a condition $y_D P + e_D R_D = hP$ is satisfied.

26. A system comprising:

a first device;

a second device; and a communications device adapted to:

receive and store a product $R_D$ from the first device, wherein $R_D$ is a product of a random value $r_D$ and a public key value P;

receive and store a product $R_B$ and a challenge value $e_D$ from the second device, wherein $R_B$ is a product of a random value $r_B$ and the public key value P;

transmit the challenge value $e_D$ to the first device;

receive and store a value $y_D$ and a challenge value $e_B$ from the first device, wherein a first expression involving the value $y_D$, the random value $r_D$ and the challenge value $e_D$ has a value equivalent to a product hP of the value h and the public key value P;

transmit the challenge value $e_B$ to the second device;

receive and store the value $y_B$ from the second device, wherein a second expression involving the value $y_B$, the challenge value $e_B$ and the random value $r_B$ has a value equivalent to the product hP; and determine that the first device and the second device are both in possession of the value h when a condition $y_B P + e_B R_B = y_D P + e_D R_D$ is satisfied.

27. The system of claim 26, wherein the first device comprises a wireless handheld device.

28. The system of claim 26, wherein the second device comprises an enterprise server.

\* \* \* \* \*